US012674832B2

(12) United States Patent
Shido

(10) Patent No.: US 12,674,832 B2
(45) Date of Patent: Jul. 7, 2026

(54) EVALUATION CIRCUIT, SEMICONDUCTOR DEVICE, AND EVALUATION METHOD

(71) Applicant: Winbond Electronics Corp., Taichung City (TW)

(72) Inventor: Taihei Shido, Yokohama (JP)

(73) Assignee: WINBOND ELECTRONICS CORP., Taichung City (TW)

( * ) Notice: Subject to any disclaimer, the term of this patent is extended or adjusted under 35 U.S.C. 154(b) by 280 days.

(21) Appl. No.: 18/350,376

(22) Filed: Jul. 11, 2023

(65) Prior Publication Data

US 2024/0110967 A1 Apr. 4, 2024

(30) Foreign Application Priority Data

Sep. 30, 2022 (JP) ................................. 2022-157241

(51) Int. Cl.
*G01R 31/26* (2020.01)
*G01R 31/27* (2006.01)

(52) U.S. Cl.
CPC ....... *G01R 31/2621* (2013.01); *G01R 31/275* (2013.01)

(58) Field of Classification Search
CPC ........................... G01R 31/2621; G01R 31/275
See application file for complete search history.

(56) References Cited

U.S. PATENT DOCUMENTS

2003/0062521 A1 4/2003 Jang et al.
2008/0191728 A1* 8/2008 Attalla ............... G01R 31/2884
257/E23.001

| | | | |
|---|---|---|---|
| 2008/0224725 A1* | 9/2008 | Sugawa | G01R 31/275 |
| | | | 257/E21.531 |
| 2009/0243645 A1 | 10/2009 | Shinkawata | |
| 2013/0181723 A1 | 7/2013 | Mauider et al. | |
| 2015/0042372 A1 | 2/2015 | Pan et al. | |
| 2017/0155392 A1* | 6/2017 | Suzuki | H01L 22/34 |
| 2019/0277908 A1* | 9/2019 | Kuroda | G01R 31/2879 |

FOREIGN PATENT DOCUMENTS

| | | |
|---|---|---|
| CN | 110323206 A | 10/2019 |
| JP | 2010-147224 A | 7/2010 |
| JP | 4973157 B2 | 7/2012 |
| JP | 2015-220632 A | 12/2015 |
| TW | 200723691 A | 6/2007 |
| TW | 201003990 A | 1/2010 |
| TW | 201935016 A | 9/2019 |

* cited by examiner

*Primary Examiner* — Judy Nguyen
*Assistant Examiner* — Adam S Clarke
(74) *Attorney, Agent, or Firm* — Birch, Stewart, Kolasch & Birch, LLP

(57) ABSTRACT

An evaluation circuit, a semiconductor device using the evaluation circuit, and an evaluation method using the evaluation circuit are provided to correctly measure the voltage values of individual transistors, while ensuring that there are fewer than four types of measured voltage values. The evaluation circuit includes a first switch element and a second switch element. The first switch element is disposed between a drain of the transistor and a first drain power supply. The second switch element is connected in parallel to the first switch element and disposed between the drain and a second drain power supply. A source of the transistor is electrically connected to A source power supply. A voltage applied to the second drain power supply is equal to a voltage applied to the source power supply.

15 Claims, 7 Drawing Sheets

EVALUATION CIRCUIT, SEMICONDUCTOR DEVICE, AND EVALUATION METHOD

CROSS REFERENCE TO RELATED APPLICATIONS

This application claims priority of Japan Patent Application No. 2022-157241 filed on Sep. 30, 2022, the entirety of which is incorporated by reference herein.

BACKGROUND OF THE INVENTION

Field of the Invention

The present invention relates to an evaluation circuit, a semiconductor device, and an evaluation method.

Description of the Related Art

In recent years, continuous progress of miniaturization in the electronics industry has been accompanied by a concomitant lowering of threshold voltages. Likewise, substrate bias coefficients have been degraded. These are referred to as "short channel effects," and they can cause increased fluctuations in the characteristics wafer elements. Thus, the semiconductor devices are adversely affected by said short channel effects.

There is a method to measure the characteristics of elements in advance and then to set up test element groups (TEGs) to evaluate the characteristics of the test elements included in each TEG. Evaluation of the TFGs can help predict the characteristics of the actual working elements in the semiconductor devices and the relationship between the actual working elements and the circuit.

BRIEF SUMMARY OF THE INVENTION

One objective of the present invention is to solve the problems of the prior art and provide an evaluation circuit and a semiconductor device using the evaluation circuit, which can correctly measure the voltage values of individual transistors and make sure that there are fewer than four types of measured voltage values. In addition, another objective of the present invention is to provide an evaluation method that can correctly measure the voltage values of individual transistors and, at the same time, make sure that there are fewer than four types of measured voltage values.

The present invention provides an evaluation circuit that comprises transistor. The evaluation circuit comprises a first switch element and a second switch element. The first switch element is disposed between a drain of the transistor and a first drain power supply. The second switch element is connected in parallel to the first switch element and disposed between the drain and a VSS power supply. A source of the transistor is electrically connected to a source power supply. A voltage applied to the VSS power supply is equal to a voltage applied to the source power supply.

In the evaluation circuit of the present invention, by electrically connecting the source of the transistor to the source power supply, the voltage applied to the VSS power supply is equal to the voltage applied to the source power supply. Therefore, it is not necessary to measure the source voltage. In the evaluation circuit, at least three types of voltages, including the source power supply, the gate power supply, and the first drain power supply, are measured. In addition, by disposing the first switch element between the drain of the transistor and the first drain power supply, the first drain power supply and the transistor can be separated. At the same time, by connecting the second switch element to the first switch element in parallel and disposing the second switch element between the drain and the VSS power supply, the VSS power supply and the transistor can be separated. Accordingly, the element voltages can be measured correctly.

In a preferred embodiment, the evaluation circuit further comprises a third switch element disposed between the drain of the transistor and a second drain power supply. The third switch element is electrically connected to a second drain power-supply pad. In this way, the second drain power supply and the transistor can be separated. In addition, even if the second drain power supply is added as a second drain power-supply pad to be measured, there are four types of voltages to be measured.

In a preferred embodiment, the evaluation circuit further comprises a fourth switch element disposed between the first drain power supply and the source power supply. The fourth switch element is connected to the transistor and the first switch element in parallel. The element characteristics of the fourth switch element are the same as the element characteristics of the first switch element. Since the fourth switch element has the same characteristics as the first switch element, the drain of the transistor is provided with only a first drain power-supply pad and a second drain power-supply pad.

None of the first, second, third, and fourth switch elements is disposed on the source of the transistor.

In a preferred embodiment of the present invention, for example, any one of the first, second, third, and fourth switch elements may comprise two field effect transistors. source terminals of the two field effect transistors are connected to each other, and drain terminals of the two field effect transistors are connected to each other.

The present invention provides a semiconductor device that comprises the evaluation circuit recited in one of the above embodiments.

The present invention provides an evaluation method. The evaluation method comprises the following steps of through using the evaluation circuit recited in one of the embodiments above, measuring an element-to-be-measured in the evaluation circuit; in response to the element-to-be-measured comprising the first switch element and the third switch element, causing the first switch element and the third switch element to be in a turned-on state; and in response to the element-to-be-measured is another element other than the first switch element and the third switch element, causing the first switch element and the third switch element to be in a turned-off state for measurement of the element.

The evaluation circuit and the evaluation method provided by the present invention can correctly measure the voltage values of individual transistors and, at the same time, ensure there are fewer than four types of measured voltage values.

BRIEF DESCRIPTION OF THE DRAWINGS

The present invention can be more fully understood by reading the subsequent detailed description and examples with references made to the accompanying drawings, wherein:

FIG. 6 is a structural diagram of a conventional evaluation circuit; and.

DETAILED DESCRIPTION OF THE INVENTION

The following description is made for the purpose of illustrating the general principles of the invention and should not be taken in a limiting sense. The scope of the invention is best determined by reference to the appended claims.

For example, i×j transistors are arranged on i rows and j columns to form a matrix. It is assumed that each transistor is defined as m(i,j). In order to measure the transistor m(1,1), due to the leakage current flowing the transistors m(1,1) and m(2,1) and the transistors arranged on the same row as the transistors m(1,1) and m(2,1), it is practically impossible to measure the drain-source current of the transistor m(1,1). Therefore, in an TEG, selectors are usually disposed between the transistor as switch elements to solve the problem induced by leakage currents By deactivating the selectors, each transistor is separated from the adjacent transistors so that a measurement operation can be performed on the transistors.

Figure 6:
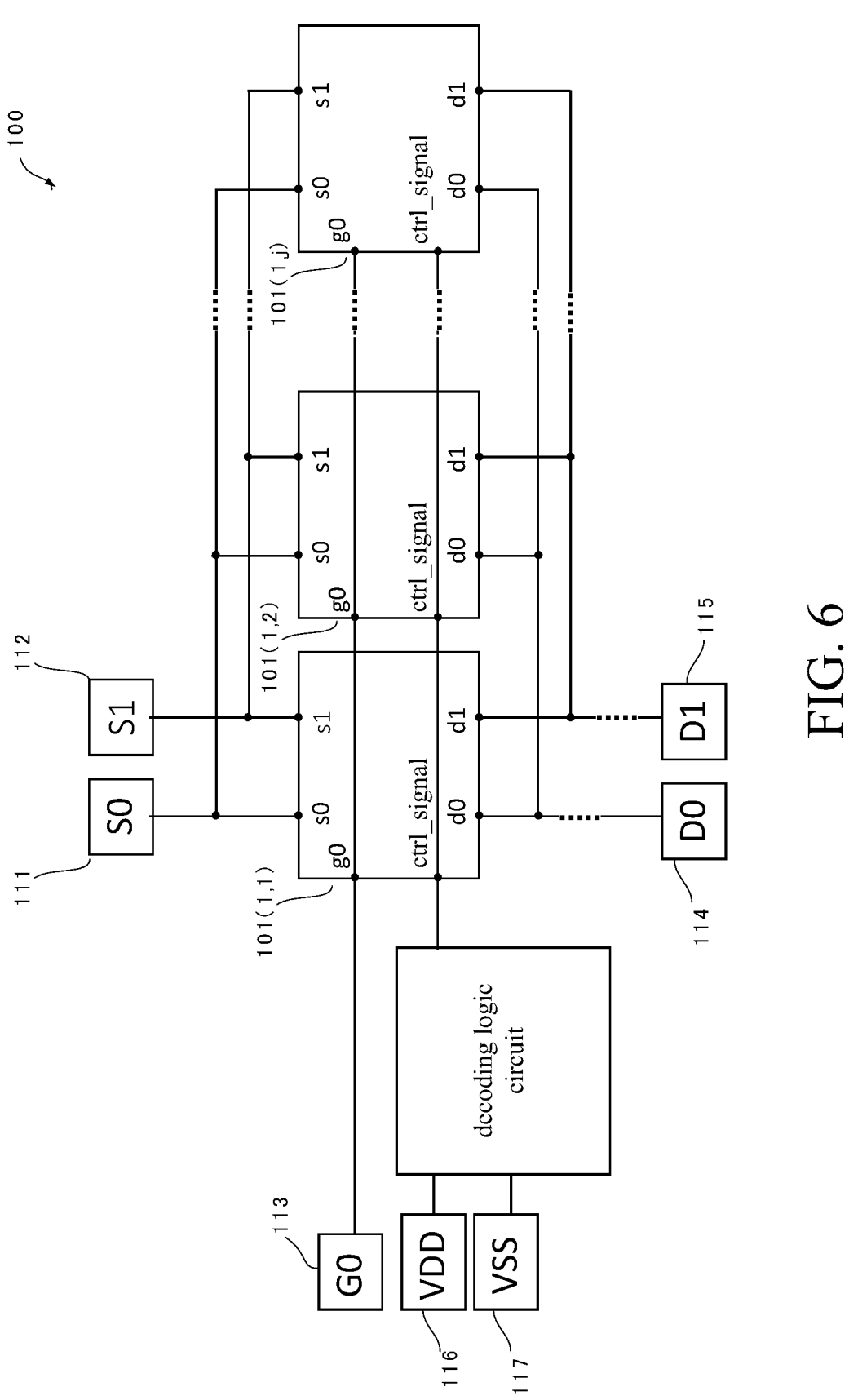
Figure 7:
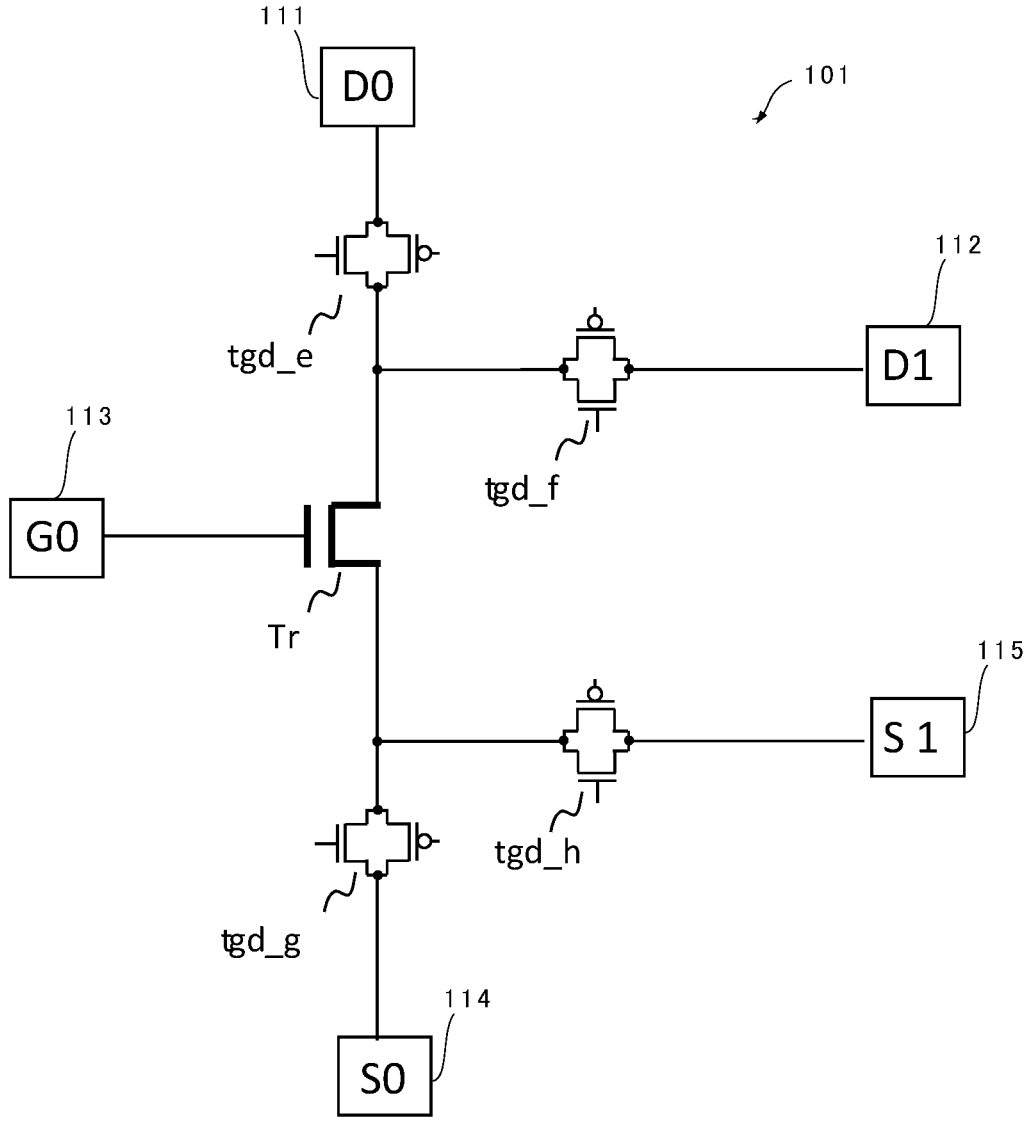
FIG. 7 is a structure diagram of elements of a conventional evaluation circuit.

In addition, when a transistor is measured by setting TEGs, a desired voltage is applied to the source, drain, and gate of the transistor and evaluated by measuring the drain-source current. For example, five pads are provided for power sources, and the voltage value and current value of each pad are measured. The related operation is described by referring to FIG. 6. FIG. 6 is a structural diagram of a conventional evaluation circuit. FIG. 7 is a structure diagram of elements of a conventional evaluation circuit.

The element 101 in a conventional TEG comprises a transistor (field effect transistor, MOSFET) Tr and four selectors tgd_e-tgd_h. The drain of the transistor Tr is coupled to first and second drain power-supply pads 111 and 112 through selectors tgd_e and tgd_f respectively, and the source thereof is coupled to first and second source power-supply pads 114 and 115 through selectors tgd_g and tgd_h respectively. In addition, the gate of the transistor Tr is coupled to a gate power-supply pad 113.

In the circuit of FIG. 6, the transistor Tr of the measurement element 101(1,1) operates to cause the selectors tgd_e-tgd_h of all elements 101(1, 2 . . . j) other than the element 101(1,1) to be inactivated. Accordingly, the transistor Tr of the element 101(1, 1) is separated from the other transistors Tr in the element 101, and the current (the current flowing from the first drain power-supply pad 111 to the first source power-supply pad 114) flows only to the transistor Tr of the element 101(1,1).

In order to measure the transistor Tr of the element 101(1,1), it is necessary to measure the gate voltage, the drain voltage and the source voltage of the transistor Tr. The selectors tgd_e and tgd_g that are used to separate the element 101 from the adjacent elements 101 are disposed on the source and drain respectively. For the current flowing from the first drain power-supply pad 111 to the first source power-supply pad 114, these selectors are provided as resistors. Thus, the voltage measurement of the transistor Tr cannot be performed correctly through the measurement only on the first drain power-supply pad 111, the gate power-supply pad 113, and the first source power-supply pad 114. In order to measure the voltages of the transistor Tr, it is necessary to measure the voltages of the first drain power-supply pad 111, the second drain power-supply pad 112, the gate power-supply pad 113, the first source power-supply pad 114, and the second source power-supply pad 115. The first drain power-supply pad 111 and the second drain power-supply pad 112 are for measuring the drain voltage. The gate power-supply pad 113 is for measuring the gate voltage. The first source power-supply pad 114 and the second source power-supply bonding pad 115 are for measuring the source voltage. In addition, the semiconductor device 100 shown in FIG. 6 comprises a VDD power-supply pad 116 and a VSS power-supply pad 117. The VSS power-supply pad 117 is a power-supply pad for applying a power-supply voltage Vss to the source of the transistor Tr. The VDD power-supply pad 116 is a power-supply pad for applying a power-supply voltage Vdd to the drain of the transistor Tr. Although these power-supply pads apply voltages having set levels, the actual values may differ from the set voltages. Thus, the voltage measurement is required.

Since the voltage applied from the first drain power-supply pad 111 is equal to the voltage applied from the VDD power-supply pad 116, only the voltage of the VDD power-supply pad 116 is measured, but the measurement on the voltage of the first drain power-supply pad 111 is not required. In addition, since the voltage applied from the first source power-supply pad 114 is equal to the voltage applied from the VSS power-supply pad 117, only the voltage in the VSS power-supply pad 117 is measured, but the measurement on the voltage of the first source power-supply pad 114 is not required. Therefore, in actual measurement, five types of voltages are measured, including the voltages of the VDD power-supply pad 116, the VSS power-supply pad 117, the gate power-supply pad 113, the second source power-supply pad 115, and the second drain power-supply pad 112.

However, depending on the type of voltage measurement device (the device that measures the voltages of the power-supply pads with a probe), up to four types of voltages can be measured. Therefore, depending on the type of voltage measurement device, it is not possible to measure all the voltages of the conventional TEGs shown in the prior art, and, thus, the measurement operation cannot be performed.

Hereinafter, an evaluation circuit, a semiconductor device, and an evaluation method in the embodiments of the present invention will be described in detail with reference to the accompanying drawings. However, these embodiments are only examples, and the present invention is not limited thereto.

Figure 1:
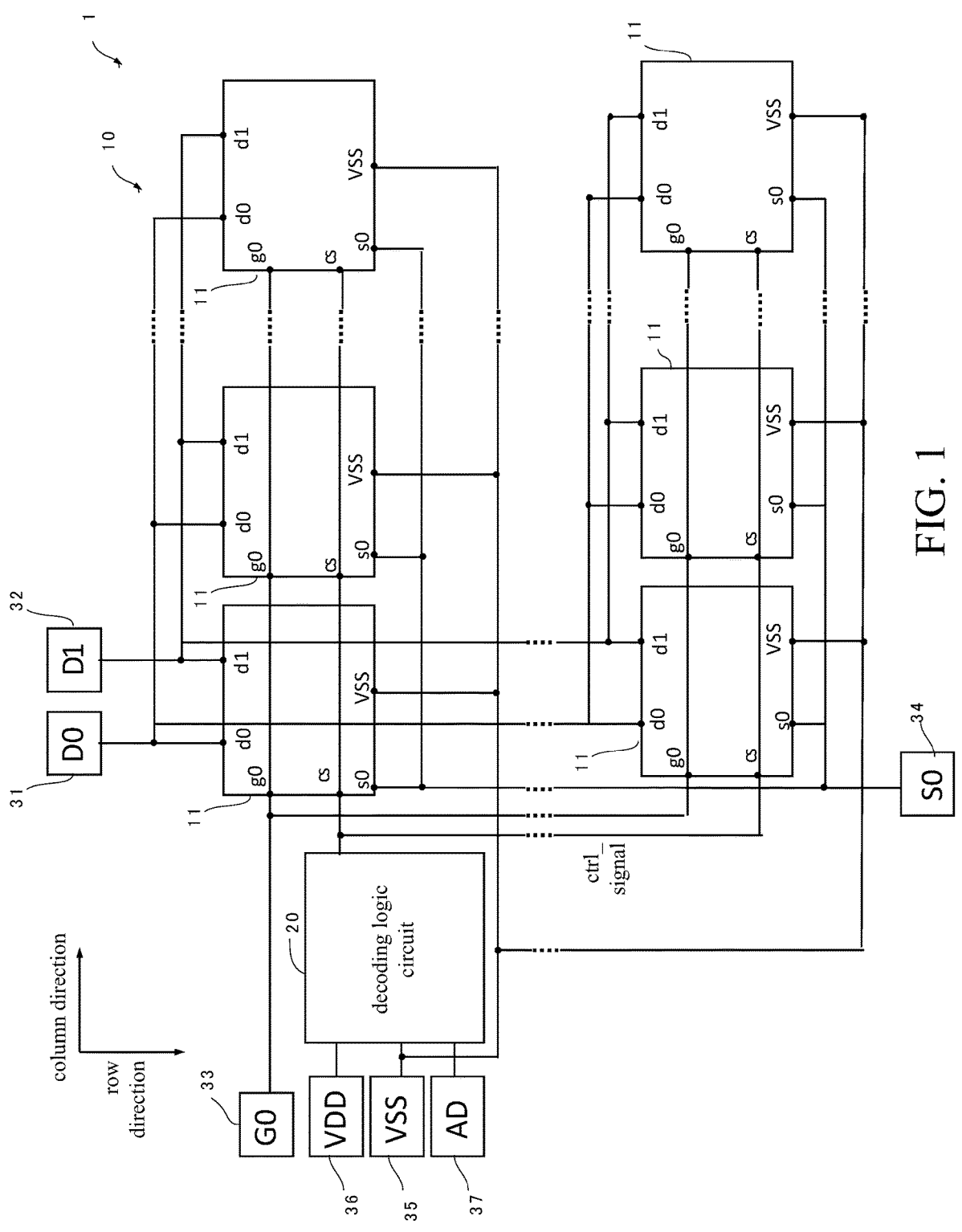
FIG. 1 is a structural diagram of an evaluation circuit according to an embodiment of the present invention.

As shown in FIG. 1, the semiconductor device 1 comprises a test element group (TEG) 10 of an evaluation circuit and a decoding logic circuit 20 on a semiconductor substrate (not shown in FIG. 1). The semiconductor device 1 further comprises a first drain power-supply pad 31, a second drain power-supply pad 32, a gate power-supply pad 33, a source power-supply pad 34, a VSS power-supply pad 35, a VDD power-supply pad 36, and an AD power-supply pad 37.

The decoding logic circuit 20 outputs an input signal ctrl_signal based on input signals from a plurality of control circuits that are not shown in the drawings. The input signal ctrl_signal is output to specify one specific element 11 among the elements 11 to be measured. The input signal ctrl_signal is generated from address signals used to specify positions of elements.

Figure 2:
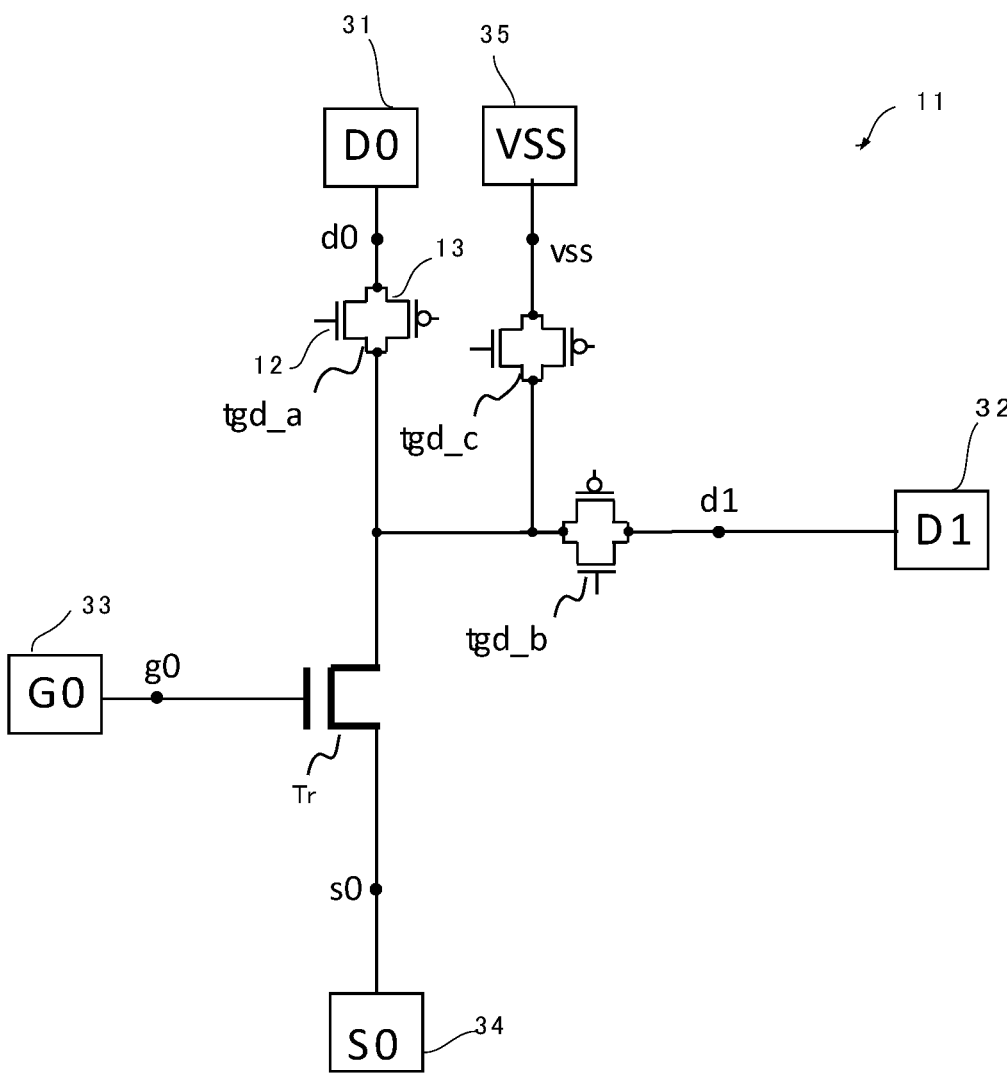
FIG. 2 is a structure diagram of elements of an evaluation circuit according to an embodiment of the present invention.

In the test element group 10 of the embodiment, the measurement elements 11 are arranged in a matrix form. In other words, the measurement elements 11 are arranged on i rows in a row direction and j columns in a column direction to form a matrix and connected with each other. In addition, each of i and j is an integer greater than or equal to i. In FIG. 1, only a part of the test element group 10 is shown. The circuit structure of each element 11 is as shown in FIG. 2. In addition, in order to distinguish the components of one element 11 from those of the other elements 11 based on the positions of the elements, a position (i,j) is assigned to the element or its components in the embodiment.

The element 11 comprises a first drain terminal d0, a first drain power-supply pad 31, a second drain terminal d1, a second drain power-supply pad 32, a gate terminal g0, a gate power-supply pad 33, a source terminal s0, a source power-supply pad 34, a VSS terminal vss, and a VSS power-supply pad 35. In addition, the element 11 further comprises an input terminal cs for inputting the input signal ctrl_signal from the decoding logic circuit 20.

The first drain power-supply pad 31 and the second drain power-supply pad 32 are power-supply pads that are configured to apply voltages to the drain of the transistor Tr of the element 11 shown in FIG. 2. The gate power-supply pad 33 is a power-supply pad that is configured to apply a voltage to the gate of the transistor Tr. By applying a threshold voltage to the gate of the transistor Tr, the state of the transistor Tr can be switched between a turned-on (ON) state and a turned-off (OFF) state. Similarly, the source power-supply pad 34 is a power-supply pad that is configured to apply a voltage to the source of the transistor Tr. The VSS power-supply pad 35 is a power-supply pad that is configured to apply a power-supply voltage Vss to the drain of the transistor Tr, and the VDD power-supply pad 36 is a power-supply pad that is configured to apply a power-supply voltage Vdd to the drain of the transistor Tr. The VSS power-supply pad 35 and the VDD power-supply pad 36 supply the power-supply voltages to the decoding logic circuit 20. The power-supply voltage Vdd applied to the drain may be greater than the power-supply voltage Vss applied to the source. For example, when the power-supply voltage Vdd applied to the drain is positive, the power-supply voltage Vss applied to the source is grounded, or the power-supply voltage Vss has a negative value lower than the power-supply voltage Vdd. In addition, the AD power-supply pad 37 is an address power supply that is configured to generate a signal for selecting one element 11 of the test element group 10, and the signal is input to the decoding logic circuit 20.

As described above, the element 11 shown in FIG. 2 comprises the transistor Tr that is implemented by an N-type field effect transistor (MOSFET). The gate of the transistor Tr is electrically connected to the gate terminal g0, and the source of the transistor Tr is electrically connected to the source terminal s0. The drain of the transistor Tr is connected to the first drain terminal do through a selector tgd_a (corresponding to the first switch element of the present invention), connected to the second drain terminal d1 through a selector tgd_b (corresponding to the third switch element of the present invention), and further connected to the VSS terminal vss through a selector tgd_c (corresponding to the second switch element of the present invention). The terminals of the transistor Tr are connected to the corresponding power-supply pads shown in FIG. 1. Therefore, the gate of the transistor Tr is directly electrically connected to the gate power-supply pad 33 without passing through any selector. The source of the transistor Tr is also directly electrically connected to the source power-supply pad 34 without passing through any selector.

All of the selectors tgd_a-tgd_c have the same circuit structure, and each of the selectors tgd_a-tgd_c comprises an N-type MOSFET 12 and a P-type MOSFET 13. The sources of MOSFET 12 and MOSFET 13 are connected to each other, and the drains of MOSFET 12 and MOSFET 13 are connected to each other. The selectors tgd_a-tgd_c operate as switches. Although the operation of the MOSFET 12 and MOSFET 13 are not shown in the drawings of the embodiment, voltages can be applied to the gates of the MOSFET 12 and MOSFET 13 to respectively activate/deactivate them, thereby achieving a turned-on (ON)/turned-off (OFF) operation of the respective switches. Based on the ON/OFF operation, the transistor Tr of one element 11 is separated from the transistors Tr of the adjacent elements 11.

Specifically, for each element 11, when the transistor Tr is to be measured, the input signal ctrl_signal is input to the element 11 serving as the measured object from the decoding logic circuit 20 so that the selectors tgd_a and the selector tgd_b are activated but the selector tgd_c is deactivated. In addition, the input signal ctrl_signal is input to the elements 11 other than the measured object from the decoding logic circuit 20d so that the selectors tgd_a and the selector tgd_b each of the elements 11 excluding the measured object are deactivated but the selector tgd_c thereof is activated.

Figure 3:
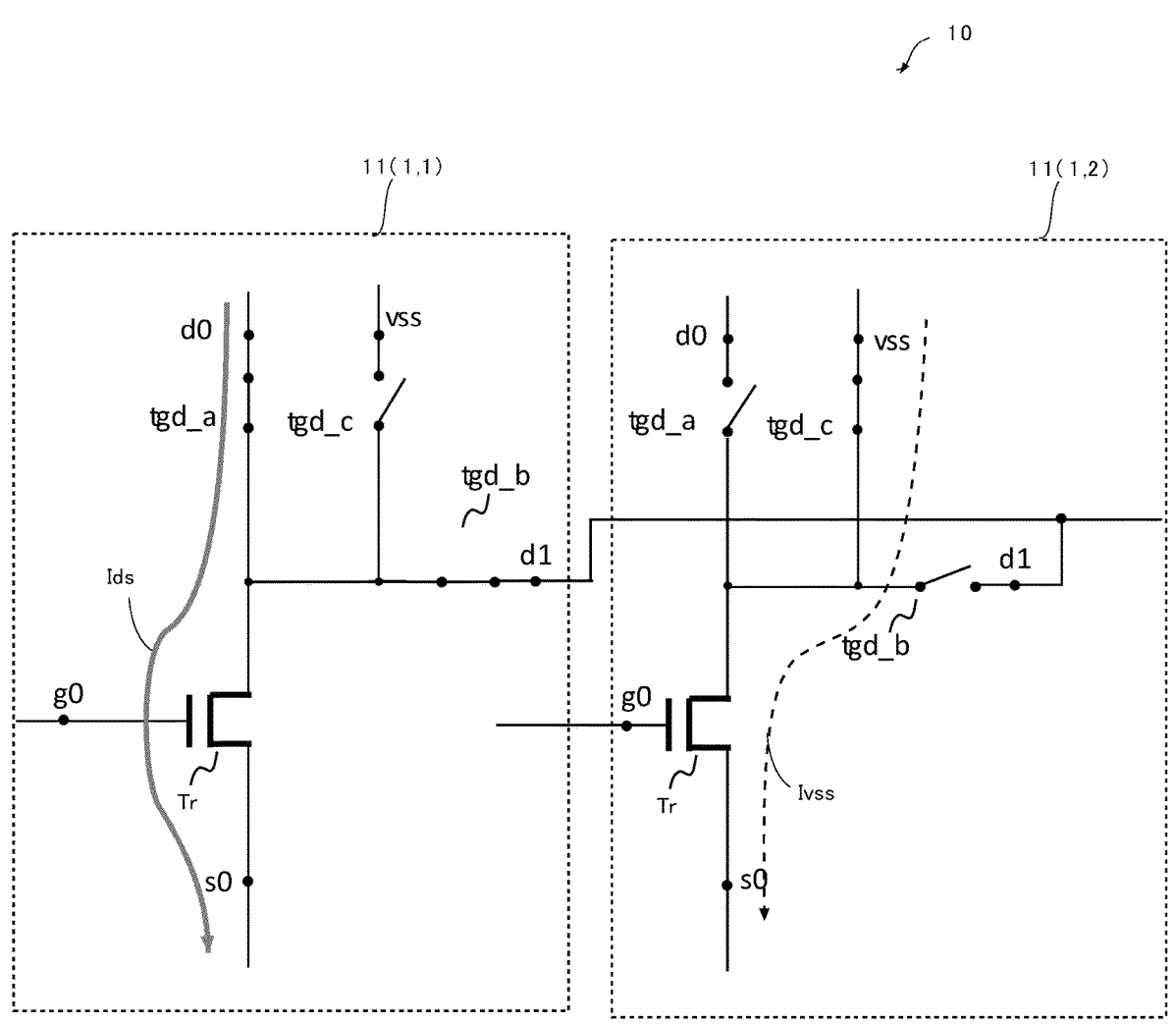
FIG. 3 is a flow chart of operations of elements of an evaluation circuit related to the first embodiment according to an embodiment of the present invention.

For example, FIG. 3 shows the equivalent circuits of the element 11(1,1) and the element 11(1,2). In FIG. 3, the selector tgd_a and the selector tgd_b of the element 11(1,1) are in a turned-on state, and the selector tgd_c of the element 11(1,1) is in a turned-off state. In addition, the selector tgd_a and the selector tgd_b of the element 11(1,2) are in the turned-off state, and the selector tgd_c of the element 11(1,2) is in the turned-on state.

A gate voltage is applied to the transistor Tr of the element 11(1,1) so as to cause the transistor Tr of the element 11(1,1) to work. As shown in FIG. 3, the current Ids of the elements 11(1,1) to be measured is shown by the solid line, and it flows from the drain terminal d0 to the source terminal s0. In the element 11(1,2) that is not the measured object, there is no current Ids. In addition, in the element 11(1,2) adjacent to the element 11(1,1) to be measured, there is no current Ivss (represented by the dotted line) flowing from the VSS terminal vss to the source terminal s0. This is because the voltage applied to the VSS power-supply pad 35 is set to be equal to the voltage applied to the source power-supply pad 34 in the elements 11 are set to be equal, which induces no current from the VSS terminal vss to the source terminal s0.

Figure 4:
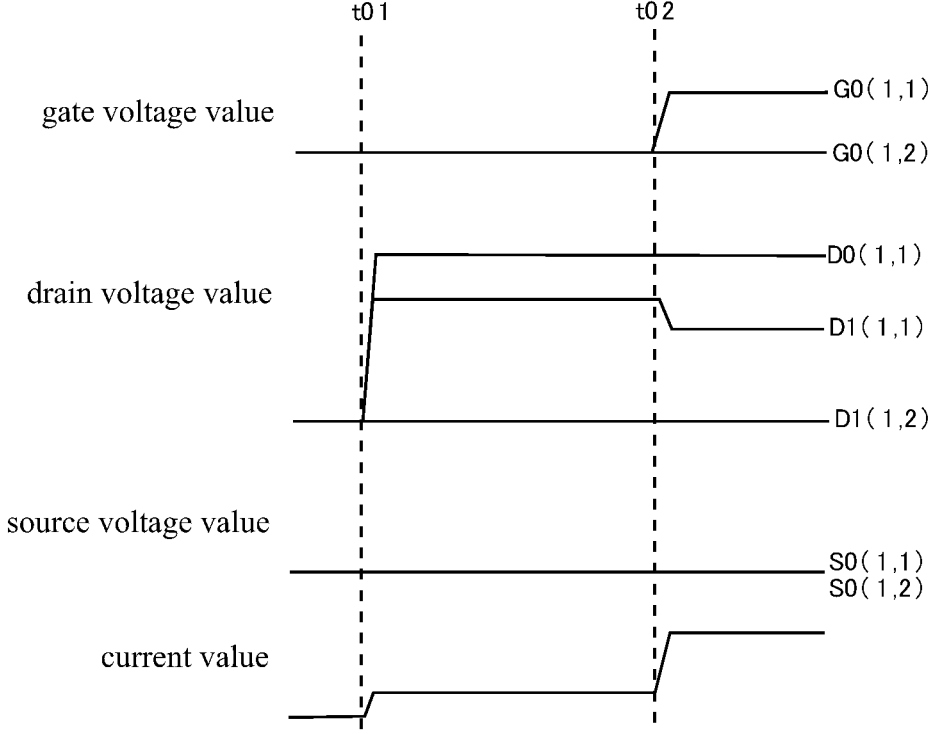
FIG. 4 is a timing diagram for explaining an operation of measuring elements of the evaluation circuit elements related to the first embodiment.

FIG. 4 is a timing diagram of the measurement of the elements 11. FIG. 4 shows voltage values of the element 11(1,1) that serves as the measured object and the element 11(1,2) adjacent to the element 11(1,1) and further shows the current flowing between the drain and the source. Similar to FIG. 3, in the elements 11(1,1) to be measured, the selector tgd_a and selector tgd_b are in the turned-on state, and the selector tgd_c is in the turned-off state. The selector tgd_a and selector tgd_b of the element 11(1,2) are is in the turned-off state, and the selector tgd_c thereof is in the turned-on state. At time t01, voltages are applied from the first and second drain power-supply pads 31 and 32. Then, after that, at time t02, a voltage is applied to the gate of the transistor Tr of the element 11(1,1) from the gate power-supply pad 33. The voltage value of the gate power-supply pad 33 is set as G0, the voltage values of the first and second drain power-supply pads 31 and 32 are set as D0 and D1 respectively, and the voltage value of the source power-supply pad 34 is set are S0. The voltage values related to element 11(1,1) are marked by (1,1), and the voltage values related to the element 11(1,2) are marked by (1,2).

As shown in FIG. 4, initially, during the period from time t01 to time t02, since no voltage is applied to any element 11 from the gate power pad 33 and no voltage is applied to any element 11 from the source power pad 34, the voltage values of the gate power pad 33 and the source power pad 34 do not change. On the other hand, a voltage having the power-supply voltage value Vdd is applied from the first drain power-supply pad 31 and the second drain power-supply pad 32. Here, actually, a minute leakage current flowing through the transistor Tr is induced. The power-supply voltage value Vdd is measured at the first drain power-supply pad 31. However, a voltage value Vd1 that is smaller than the power-supply voltage value Vdd is measured at the second drain power-supply pad 32.

Then, at time t02, the gate voltage is applied to the element 11 from the gate power-supply pad 33, and the gate is thus asserted. Accordingly, in the element 11(1,1), the current Ids flows between the drain and the source. At this time, a current Ids is generated from the second drain power-supply pad 32, and, thus, a voltage value Vd2 that is smaller than the voltage value Vd1 is measured.

In the embodiment, one element 11 is separated from the adjacent elements 11 using the selectors tgd_a-tgd_c. Thus, when the measurement is performed on the desired transistor Tr, there is no leakage current flowing between the elements 11, the characteristics of the transistor Tr can be measured correctly.

In this case, in order to obtain the characteristics of the transistor Tr, the power-supply pads that should be measured comprise the gate power-supply pad 33, the first drain power-supply pad 31, the second drain power-supply pad 32, the source power-supply pad. pad 34, the VSS power-supply pad 35, and the VDD power-supply pad. However, since the voltage applied from the first drain power-supply pad 31 is equal to the voltage value applied from the VDD power-supply pad 36, the measured voltage values are equal. In addition, since the voltage applied from the source power-supply pad 34 is equal to the voltage applied from the VSS power-supply pad 35, the measured voltage values are equal. Therefore, the voltages that are actually measured in the embodiment are the voltage of the gate power-supply pad 33, the voltage of the VDD power-supply pad 36, the voltage of the VSS power-supply pad 35, and the voltage of the second drain power-supply pad 32. In other words, four types of voltages are actually measured. Therefore, compared to conventional evaluation circuits, in the embodiment can reduce the types of voltages to be measured.

In the above embodiment, there are four types of voltages to be measured. However, in another embodiment, there are three types of voltages to be measured. The related operation will be described in detail with reference to the accompanying drawing. In addition, the same reference numerals will be given to the same components or elements as those in the first embodiment for description.

In the above embodiment, as shown in FIG. 4, when the current Ids flows through the transistor Tr, the selector tgd_a is equivalent to a resistor for the current Ids. Thus, the voltage of the second drain power-supply pad 32 is equal to the voltage Vd2 that is lower than the voltage Vdd applied from the first drain power-supply pad 31. During the measurement of the transistor Tr, it is necessary to measure the voltage of the second drain power-supply pad 32. In the embodiment, since how much the voltage of the second drain power-supply pad 32 is lower than the voltage Vdd applied from the first drain power-supply pad 31 can be obtained in advance, it is not necessary to measure the voltage of the second drain power-supply pad 32. Therefore, in the present embodiment, there are three types of voltages to be measured.

Figure 5:
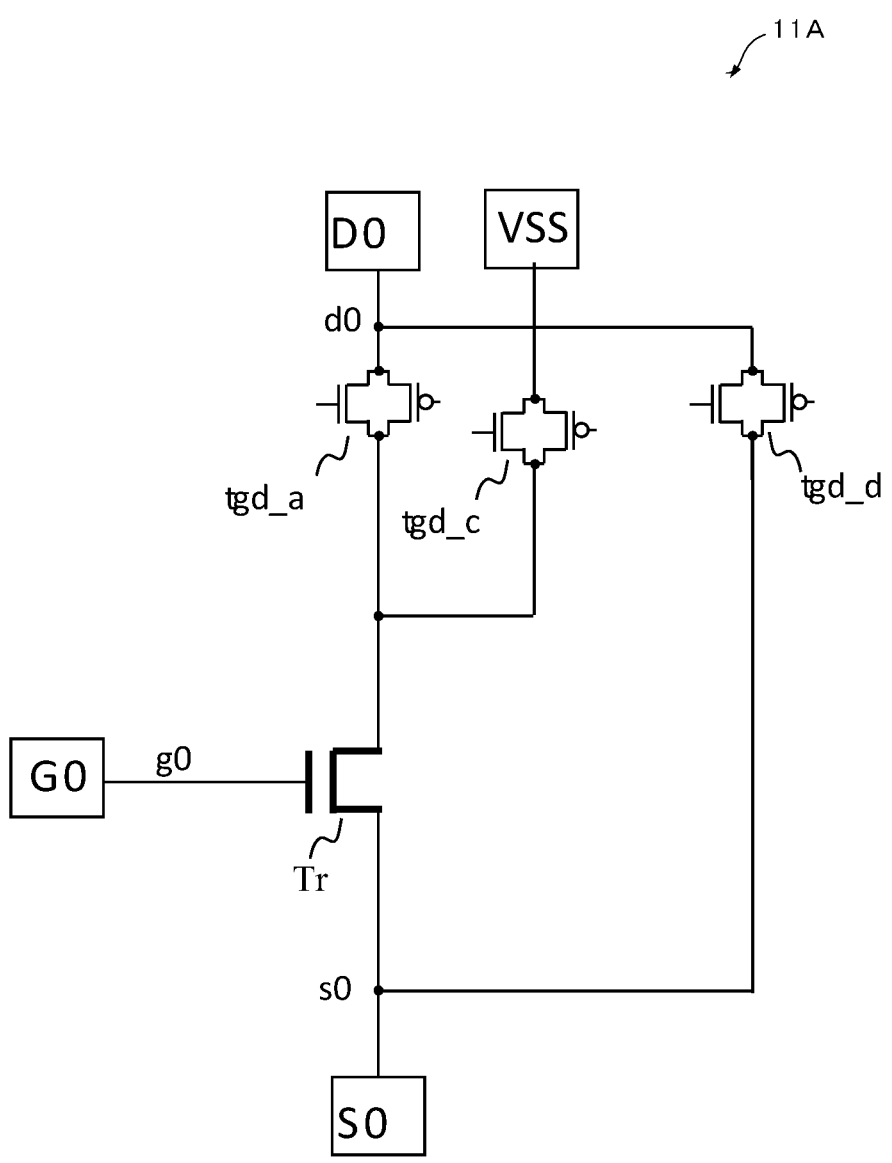
FIG. 5 is a structure diagram of the elements of the evaluation circuit related to the first embodiment 1 according to another embodiment of the present invention.

The structure of the element 11A in the embodiment is described using FIG. 5. As shown in FIG. 5, the element 11A comprises a selector tgd_d (corresponding to the fourth switch element of the present invention) disposed between the source terminal s0 and the drain terminal d0 and further connected to the selector tgd_a in parallel. The selector tgd_d has the same characteristics as the selector tgd_a. For example, the selectors tgd_d and the tgd_a are configured with the same size.

Then, only the selector tgd_d is turned on in advance, and the other selectors are turned off. Voltages are applied from the first drain power-supply pad 31 and the gate power-supply pad 33 to obtain the value of the current flowing from the first drain power-supply pad 31 to the source power-supply pad 34 at different voltage values. In other words, the voltage of the source power-supply pad 34 is set as a constant, the voltage from the first drain power-supply pad 31 is varied, and the value of the currents flowing through the respective element 11 is measured at different drain voltages applied to the transistor Tr. In this case, the value of the voltage from the first drain power-supply pad 31 is defined as an initial voltage value, and the value of the current flowing through each element 11 applied by drain voltage is defined as an initial current value.

During the measurement of the transistor Tr, the selector tgd_a of the element 11 to be measured is turned on, and the other selectors thereof are turned off. Moreover, the selectors tgd_a of the elements 11 not to be measured are turned off, and the other selectors thereof are turned on. Then, while a voltage is applied from the source power-supply pad 34, a voltage is applied from the first drain power-supply pad 31, and the current flowing to the element 11 is measured. The voltage value of the initial current value that is the same as the current value of the element 11 serves as the voltage value of the first drain power-supply pad 31.

In other words, in the embodiment, how much the drain voltage is lower than the voltage applied from the first drain power-supply pad 31 can be known by obtaining how much voltage drop is caused by the resistance value of the selector tgd_a in advance. Thus, in the embodiment, although the semiconductor device 1 is provided with the first drain power-supply pad 31, the gate power-supply pad 33, the source power-supply pad 34, the VDD power-supply pad 36, and the VSS power-supply pad 35, it is not necessary to measure the voltage value of the first drain power-supply pad 31. The voltages that are actually measured in the embodiment are the voltage of the VDD power-supply pad 36, the voltage of the gate power-supply pad 33, and the voltage of the VSS power-supply pad 35. In other words, three types of voltages are actually measured.

The configuration of the test element group 10 in each of the above-mentioned embodiments is merely an example, and it can be changed appropriately or implemented by various configurations. In addition, although the configurations of the elements 10 and 10A are illustrated in FIG. 2 and FIG. 5, these configurations are merely examples, and they can be appropriately changed or implemented by various configurations. For example, the selectors tgd_a-tgd_d are illustrated as switch elements, however, the present invention is not limited thereto. The selectors tgd_a-tgd_d can be implemented by elements or components that operate as switch elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An evaluation circuit comprising a transistor and further comprising:

a first switch element disposed between a drain of the transistor and a first drain power supply;

a second switch element connected in parallel to the first switch element and disposed between the drain and a power supply which is grounded or has a negative value;

a third switch element disposed between the drain of the transistor and a second drain power supply; and a fourth switch element disposed between the first drain power supply and the source power supply and connected to the transistor and the first switch element in parallel;

wherein a source of the transistor is electrically connected to a source power supply, wherein, a voltage applied to the power supply is equal to a voltage applied to the source power supply, and wherein the third switch element is electrically connected to a second drain power-supply pad, wherein element characteristics of the fourth switch element are the same as element characteristics of the first switch element.

2. The evaluation circuit as claimed in claim 1, wherein none of the first, second, third, and fourth switch element is disposed on the source of the transistor.

3. The evaluation circuit as claimed in claim 1, wherein one of the first, second, third, and fourth switch elements comprises two field effect transistors, source terminals of the two field effect transistors are connected to each other, and drain terminals of the two field effect transistors are connected to each other.

4. The evaluation circuit as claimed in claim 1, wherein the first drain power supply is a voltage applied to a first drain power-supply pad, wherein the second drain power supply is a voltage applied to a second drain power-supply pad, wherein the power supply is a voltage applied to a power-supply pad, and wherein the source power supply is a voltage applied to a source power-supply pad.

5. The evaluation circuit as claimed in claim 1, wherein the first drain power supply is a voltage applied to the drain of the transistor from a first drain power-supply pad, wherein the second drain power supply is a voltage applied to the drain of the transistor from a second drain power-supply pad, wherein the power supply is a voltage applied to the drain of the transistor from a power-supply pad, and wherein the source power supply is a voltage applied to the source of the transistor from a source power-supply pad.

6. The evaluation circuit as claimed in claim 5, wherein the voltage applied to the drain of the transistor from the power-supply pad is equal to the voltage applied to the source of the transistor from the source power-supply pad.

7. The evaluation circuit as claimed in claim 1, wherein the evaluation circuit operates to measure an element-to-be-measured in the evaluation circuit;

wherein in response to that the evaluation circuit operates to measure an element-to-be-measured comprising the first switch element and the third switch element, in the evaluation circuit used to element-to-be-measured being another element, the first switch element and the third switch element are in a turned-on state, and in response to that the evaluation circuit operates to measure the element-to-be-measured being another element, other than the first switch element and the third switch element, the first switch element and the third switch element are in a turned-off state.

8. A semiconductor device comprising:

a first drain power-supply pad;

a power-supply pad, which is grounded or has a negative value;

a source power-supply pad;

a second drain power-supply pad; and an evaluation circuit comprising:

a transistor;

a first switch element disposed between a drain of the transistor and the first drain power-supply pad;

a second switch element connected in parallel to the first switch element and disposed between the drain and the power-supply pad;

a third switch element disposed between the drain of the transistor and the second drain power-supply pad; and a fourth switch element disposed between the first drain power-supply pad and the source power-supply pad and connected to the transistor and the first switch element in parallel;

wherein a source of the transistor is electrically connected to the source power-supply pad, wherein, a voltage applied to the power supply pad is equal to a voltage applied to the source power-supply pad, and wherein element characteristics of the fourth switch element are the same as element characteristics of the first switch element.

9. The semiconductor device as claimed in claim 8, wherein none of the first, second, third, and fourth switch element is disposed on the source of the transistor.

10. The semiconductor device as claimed in claim 8, wherein one of the first, second, third, and fourth switch elements comprises two field effect transistors, source terminals of the two field effect transistors are connected to each other, and drain terminals of the two field effect transistors are connected to each other.

11. The semiconductor device as claimed in claim 8, wherein:

a first drain power supply is applied to the drain of the transistor through the first drain power-supply pad, a second drain power supply is applied to the drain of the transistor through the second drain power-supply pad, a voltage is applied to the drain of the transistor through the power-supply pad, and a source power supply is applied to the source of the transistor from the source power-supply pad.

12. The semiconductor device as claimed in claim 11, wherein the voltage applied to the drain of the transistor through the power-supply pad is equal to a voltage of the source power supply applied to the source of the transistor through the source power-supply pad.

13. The semiconductor device as claimed in claim 8, wherein the evaluation circuit operates to measure an element-to-be-measured in the evaluation circuit; wherein in response to that the evaluation circuit operates to measure an element-to-be-measured comprising the first switch element and the third switch element, in the evaluation circuit used to element-to-be-measured being another element, the first switch element and the third switch element are in a turned-on state, and in response to that the evaluation circuit operates to measure the element-to-be-measured being another element, other than the first switch element and the third switch element, the first switch element and the third switch element are in a turned-off state.

14. An evaluation method comprising:
through using an evaluation circuit as claimed in claim 1, measuring an element-to-be-measured in the evaluation circuit;
in response to the element-to-be-measured comprising the first switch element and the third switch element, causing the first switch element and the third switch element to be in a turned-on state; and
in response to the element-to-be-measured being another element, other than the first switch element and the third switch element, causing the first switch element and the third switch element to be in a turned-off state for measurement of the element.

15. The evaluation method as claimed in claim 14, wherein the evaluation circuit further comprises a second switch element disposed between the drain of the transistor and the power supply, and the evaluation method further comprises:
in response to the element-to-be-measured comprising the first switch element and the third switch element, causing the second switch element to be in the turned-off state; and
in response to the element-to-be-measured being another element, other than the first switch element and the third switch element, causing the second switch element to be in the turned-on state.

* * * * *